(12) United States Patent
Chen et al.

(10) Patent No.: US 7,967,146 B2
(45) Date of Patent: Jun. 28, 2011

(54) CONTAINER

(75) Inventors: Song Ping Chen, Shen Zhen (CN); Ru Zheng Liu, ShenZhen (CN)

(73) Assignee: e.PAK International, Inc., Austin, TX (US)

( * ) Notice: Subject to any disclaimer, the term of this patent is extended or adjusted under 35 U.S.C. 154(b) by 0 days.

(21) Appl. No.: 12/171,524

(22) Filed: Jul. 11, 2008

(65) Prior Publication Data
US 2009/0038963 A1 Feb. 12, 2009

(51) Int. Cl.
*B65D 81/00* (2006.01)
(52) U.S. Cl. ........................ 206/710; 206/711; 206/723
(58) Field of Classification Search .................. 206/711, 206/210, 710, 723, 832; 211/41.18
See application file for complete search history.

(56) References Cited

U.S. PATENT DOCUMENTS

| | | |
|---|---|---|
| 4,160,504 A | 7/1979 | Kudlich et al. |
| 4,171,740 A | 10/1979 | Clement et al. |
| 4,520,925 A | 6/1985 | Johnson |
| 4,557,382 A | 12/1985 | Johnson |
| D381,512 S | 7/1997 | Green |
| D382,795 S | 8/1997 | Abayhan et al. |
| 5,749,467 A * | 5/1998 | Gregerson ..................... 206/445 |
| 5,971,191 A * | 10/1999 | Yamada et al. ............... 220/378 |
| D416,794 S | 11/1999 | Cormack |
| D430,023 S | 8/2000 | Shurtleff et al. |
| D500,924 S | 1/2005 | Martin et al. |
| D505,840 S | 6/2005 | Schultz et al. |
| D510,263 S | 10/2005 | Isono et al. |
| 7,100,788 B2 | 9/2006 | Cadiente et al. |
| 7,104,416 B2 | 9/2006 | Gasco et al. |
| 2003/0221985 A1 * | 12/2003 | Yajima et al. ................. 206/454 |

OTHER PUBLICATIONS

Austrian Patent Office, Search Report and Written Opinion for Application No. 200805798-6 mailed Oct. 21, 2009.

* cited by examiner

*Primary Examiner* — J. Gregory Pickett
*Assistant Examiner* — King M Chu
(74) *Attorney, Agent, or Firm* — Carlson, Gaskey & Olds PC

(57) ABSTRACT

A portion of a container includes a plurality of first resilient support members having a first height. The first resilient support members are configured to contact an edge of a component placed in the container. A plurality of second support members each have a second, smaller height. The second support members are arranged relative to the first resilient support members such that the second support members contact the edge of the component if corresponding ones of the first resilient support members deflect a sufficient amount.

17 Claims, 5 Drawing Sheets

CONTAINER

BACKGROUND

Components for electronic and other devices typically are manufactured in one location and packaged in containers for shipment to another location. Hard drive disks and semiconductor wafers are examples of such components. The contents of the container are sensitive and may be damaged if the container is dropped or otherwise subjected to impact. It is necessary to protect against damage to the contents while they are in the container. Various attempts have been made to provide containers for such purposes.

Those skilled in the art are always striving to make improvements. This invention provides an improved container for such purposes.

SUMMARY OF THE INVENTION

An exemplary container includes a container portion with a plurality of first resilient support members having a first height. The first resilient support members are configured to contact an edge of a component placed in the container. A plurality of second support members each have a second, smaller height. The second support members are arranged relative to the first resilient support members such that the second support members contact the edge of the component if corresponding ones of the first resilient support members deflect a sufficient amount.

The various features and advantages of this invention will become apparent to those skilled in the art from the following detailed description. The drawings that accompany the detailed description can be briefly described as follows.

DETAILED DESCRIPTION

Figure 1:
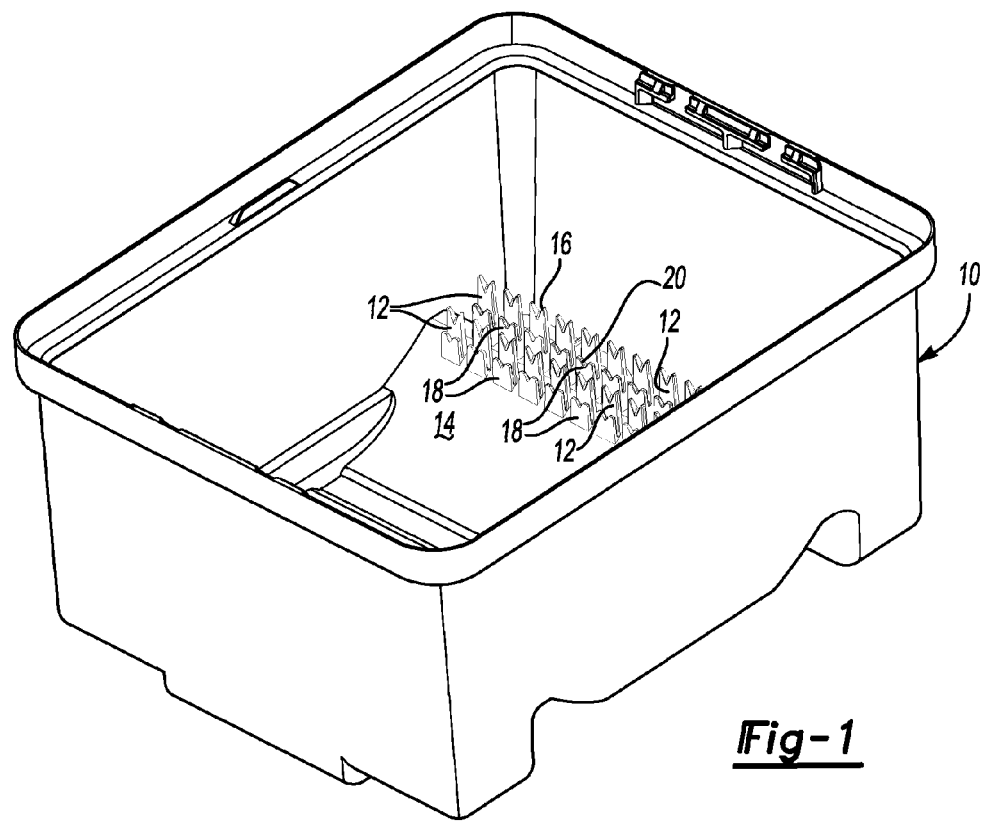
FIG. 1 is a perspective view of a portion of a container in which the inside of the portion is visible.

FIGS. 1-4 show an example portion 10 of a container for housing a plurality of components. For discussion purposes wafers or disks are considered as example components. The example container portion 10 includes a plurality of first resilient support members 12 that have a first height between an inside surface 14 on the container portion 10 and an end 16 of the first resilient support members 12. The first resilient support members 12 are configured and arranged on the container portion 10 to provide support to a plurality of disks or wafers.

The container portion 10 also includes a plurality of second support members 18. The second support members 18 have a second height that is smaller than the first height. The second height in this example is between the inside surface 14 and an end 20 of the second support members.

Figure 5:
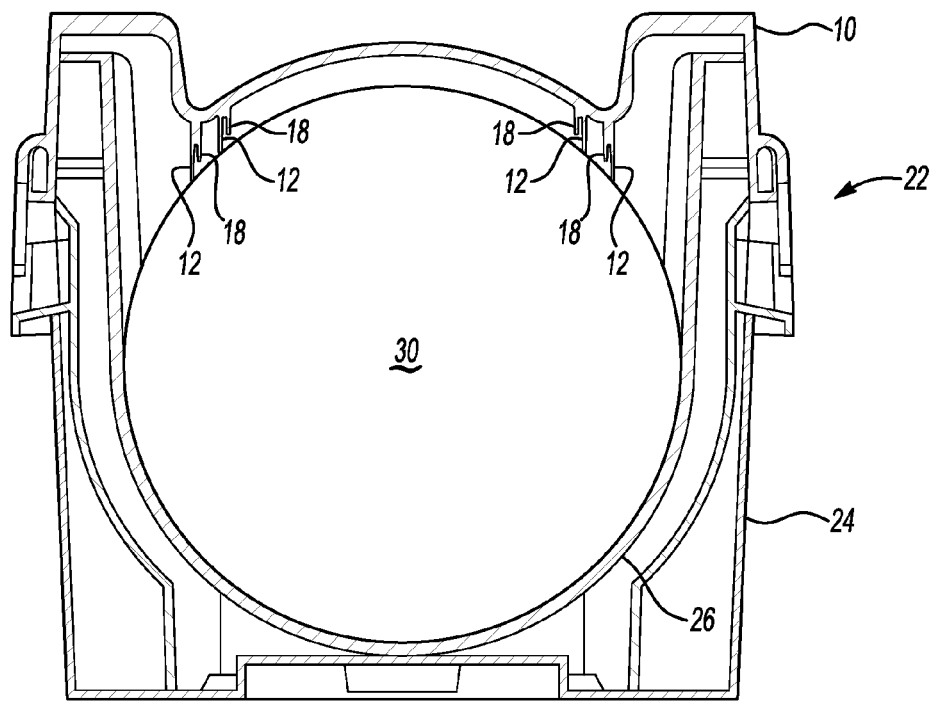
FIG. 5 is a cross-sectional view of a container including the portion of FIG. 1.

FIG. 5 shows an example container 22 including the example container portion 10. In this example, the container portion 10 provides a cover for the container 22. The container portion 10 is selectively secured to a base 24 to provide a closed container. A cassette 26 is received between the cover 10 and the base 24. The cassette 26 includes a plurality of slots for receiving disks or wafers intended to be placed in the container 22. The support members 12 and 18 provide cushioned support to any wafers or disks in the container 22 to maintain them securely within the cassette 26 when the container 22 is closed.

Figure 6:
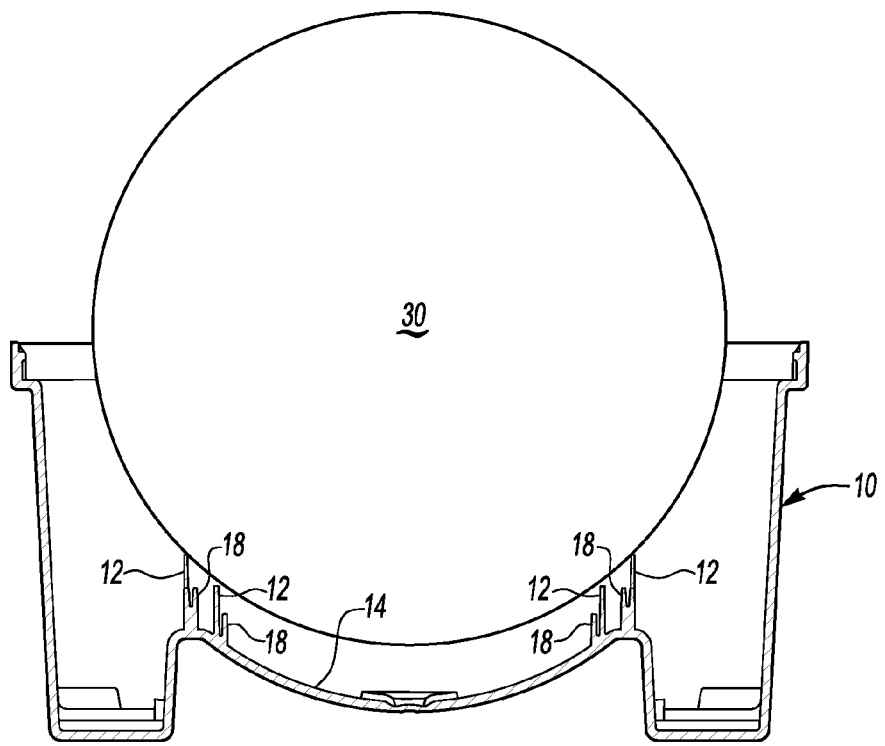
FIG. 6 is a cross-sectional view of a portion of FIG. 5 in a first operative condition.
Figure 7:
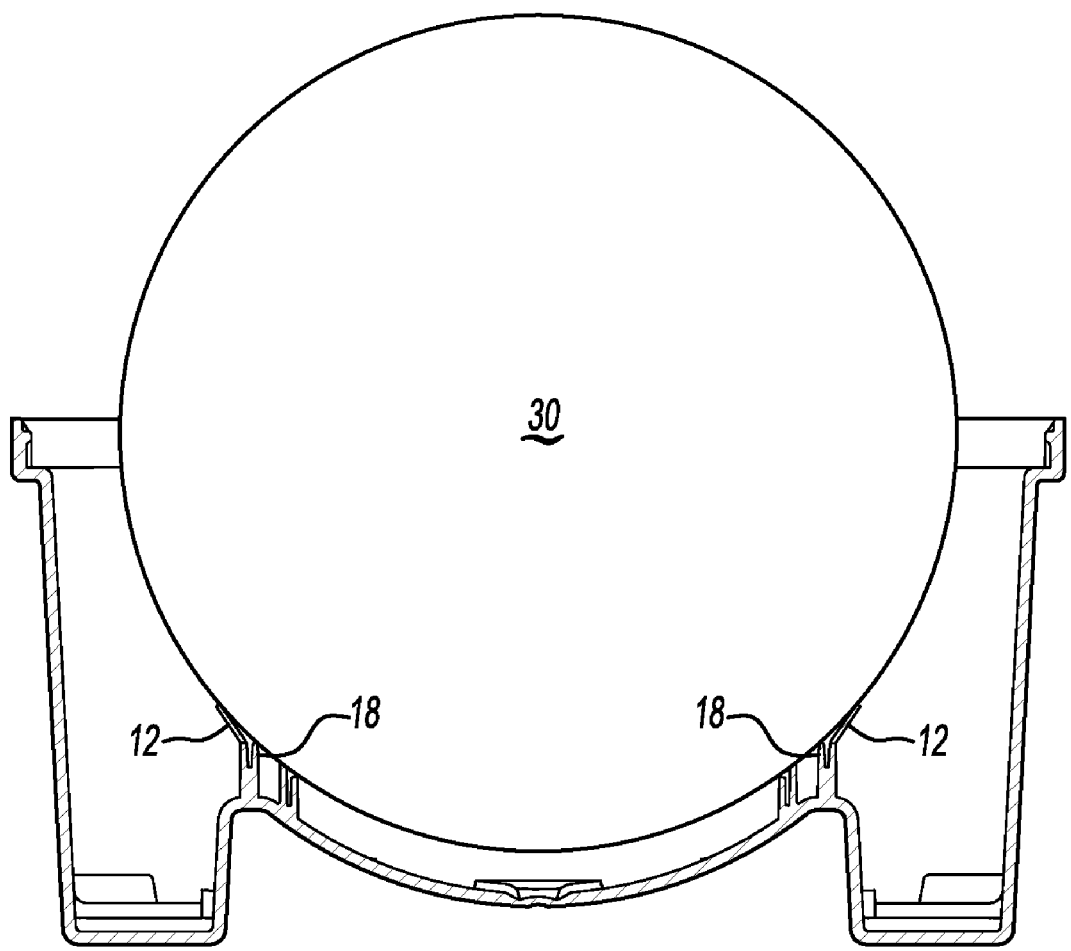
FIG. 7 is a cross-sectional view similar to FIG. 6 in a second, different operative condition.

The support members 12 and 18 also provide cushion to absorb impact forces or loads and prevent undesired movement of any wafers or disks within the container 22. In this example, the second support members 18 are arranged such that each one is adjacent a corresponding one of the first resilient support members 12. Under normal conditions, the second support members 18 will not contact a disk or wafer in contact with the first resilient support members 12. This condition is shown in FIGS. 5 and 6. If sufficient forces act on the disks or wafers 30, the first resilient support members 12 will deflect sufficiently to allow the edge of a disk or wafer 30 to contact the second support members 18. This latter condition is shown in FIG. 7.

The second support members 18 stabilize the disks or wafers 30 even when the first resilient support members 12 deflect responsive to any forces acting on the disks or wafers 30. The second support members 18 prevent contact between the disks or wafers 30 and the inside surface 14 on the container portion 10. The second support members 18 also prevent lateral movement or rotation of the disks or wafers 30 within the container 22. The combination of first resilient support members 12 and second support members 18 provides an enhanced container that better protects the contents of the container 22 from damage that might otherwise occur if the container 22 were dropped or subjected to some other impact.

In some examples, the second support members are resilient to provide a cushioning affect in addition to the cushioning effect of the first resilient support members 12. The second, smaller height of the second support members 18 renders them less resilient in some examples, which can provide enhanced stability in a condition as shown in FIG. 7. The combination of the first resilient support members 12 and the second support members 18 allows for the first support members 12 to provide a soft enough cushion without allowing the contents of the container 22 to move more than a desired amount. The stabilizing effect of the second support members 18 prevents contact between the contents and the inside surface 14, for example, even after the first resilient support members 12 deflect substantially responsive to an incident force or a load.

Figure 2:
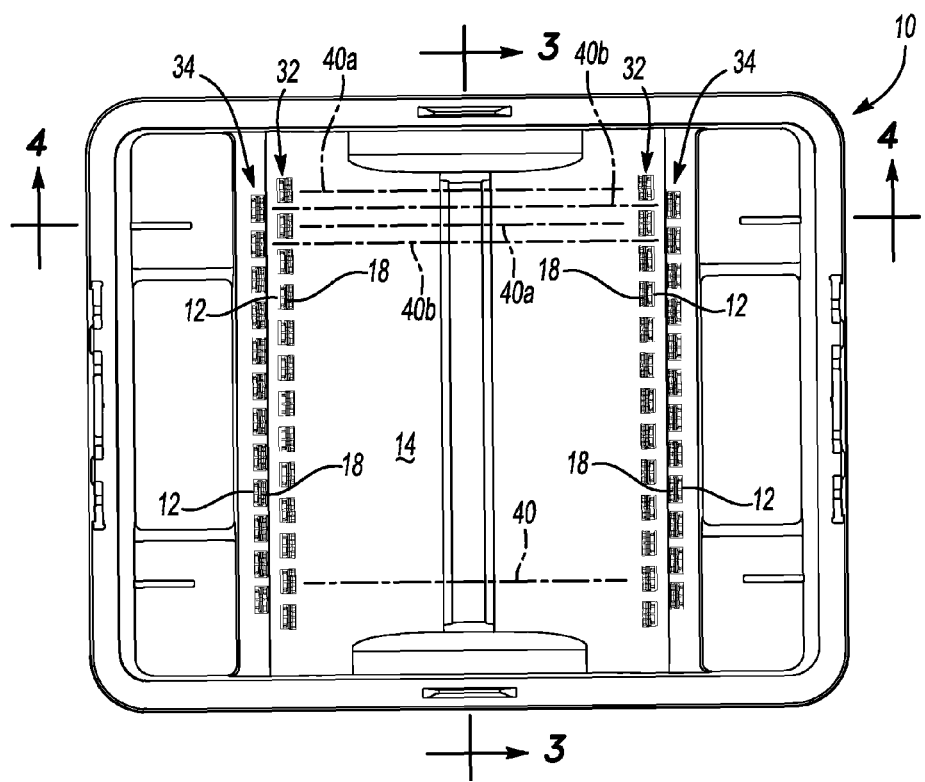
FIG. 2 is an elevational view as seen from the top in FIG. 1.
Figure 4:
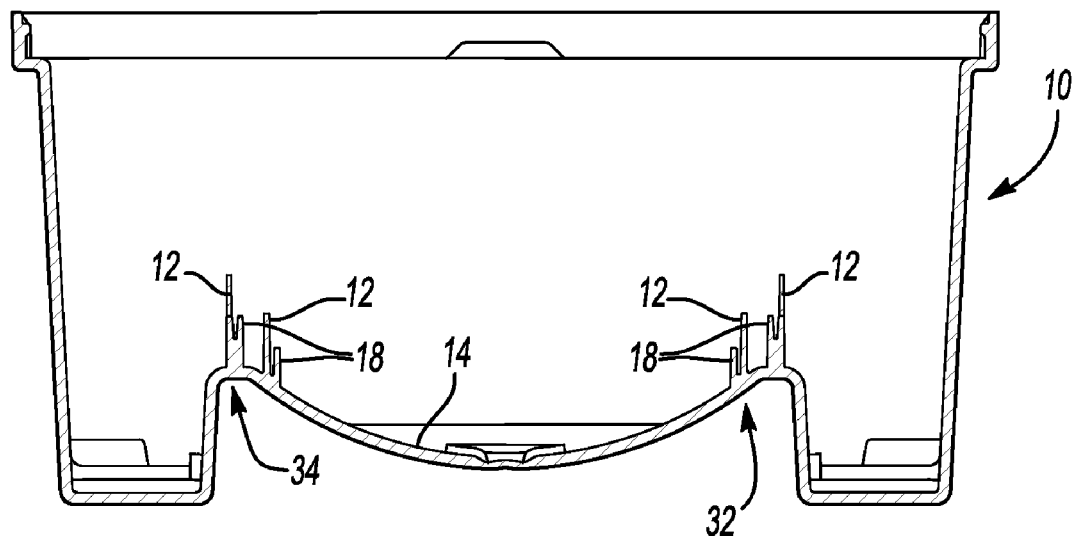
FIG. 4 is a cross-sectional view along the lines 4-4 in FIG. 2.

As best appreciated from FIGS. 2 and 4, the support members are arranged in spaced apart rows. A first set of the plurality of first resilient support members 12 is arranged in rows 32 that are spaced apart a first distance. A second set of the plurality of first resilient support members 12 is arranged in rows 34 that are spaced apart a second, greater distance. In the illustrated example, the second support members 18 are included in each of the rows with their corresponding first resilient support members 12.

One feature of the illustrated rows is that the plurality of first resilient support members 12 are configured to establish a plurality of receiving slots 40 that are each for receiving one disk or wafer 30. Receiving slots 40a are each established by two of the support members of the first set in the rows 32. Receiving slots 40*b* are each established by two of the support members in the second set in the rows 34. The first and second sets are arranged in an alternating manner along the rows such that every other receiving slot 40 is established by two support members from a different set. In other words, the receiving slots 40*a* established by support members of the first set are adjacent one of the receiving slots 40*b* established by support members of the second set.

The example support member ends 16 and 20 have a contour configured to center the edge of a disk or wafer 30 in the corresponding receiving slot 40. In this example, the ends 16 and 20 have a generally V-shaped contour.

Figure 3:
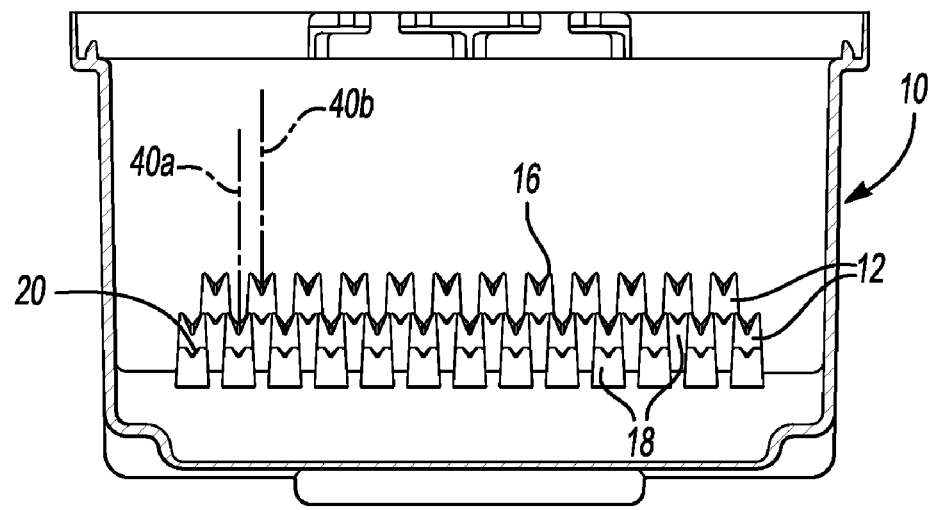
FIG. 3 is a cross-sectional view along the lines 3-3 in FIG. 2.

One feature of the alternating arrangement can be best appreciated from FIGS. 2 and 3. If a disk or wafer 30 intended to be placed in a receiving slot 40*a* is accidentally misplaced to one side of the intended first resilient support members 12, it will automatically be received in an adjacent receiving slot 40*b*. This prevents misalignment of disks or wafers 30 in the container 22 and prevents ends of them from contacting each other.

Another feature of the illustrated example is that the first support members 12 in the second set (i.e., in the rows 32) are supported on the inside surface 14 of the container portion 10 such that the ends 16 are not aligned with the ends 16 of the first support members 12 in the rows 34. The different spacing between the rows and the different positions of the ends 16 in this example ensures that the edges of the disks or wafers 30 received against the support members in the different rows 32, 34 remain at approximately the same distance from the inside surface 14 regardless of which support members engage a particular disk or wafer 30.

In one example, the container portion 10 and the support members 12, 18 are integrally molded as a single piece and they comprise the same material.

Figure 8:
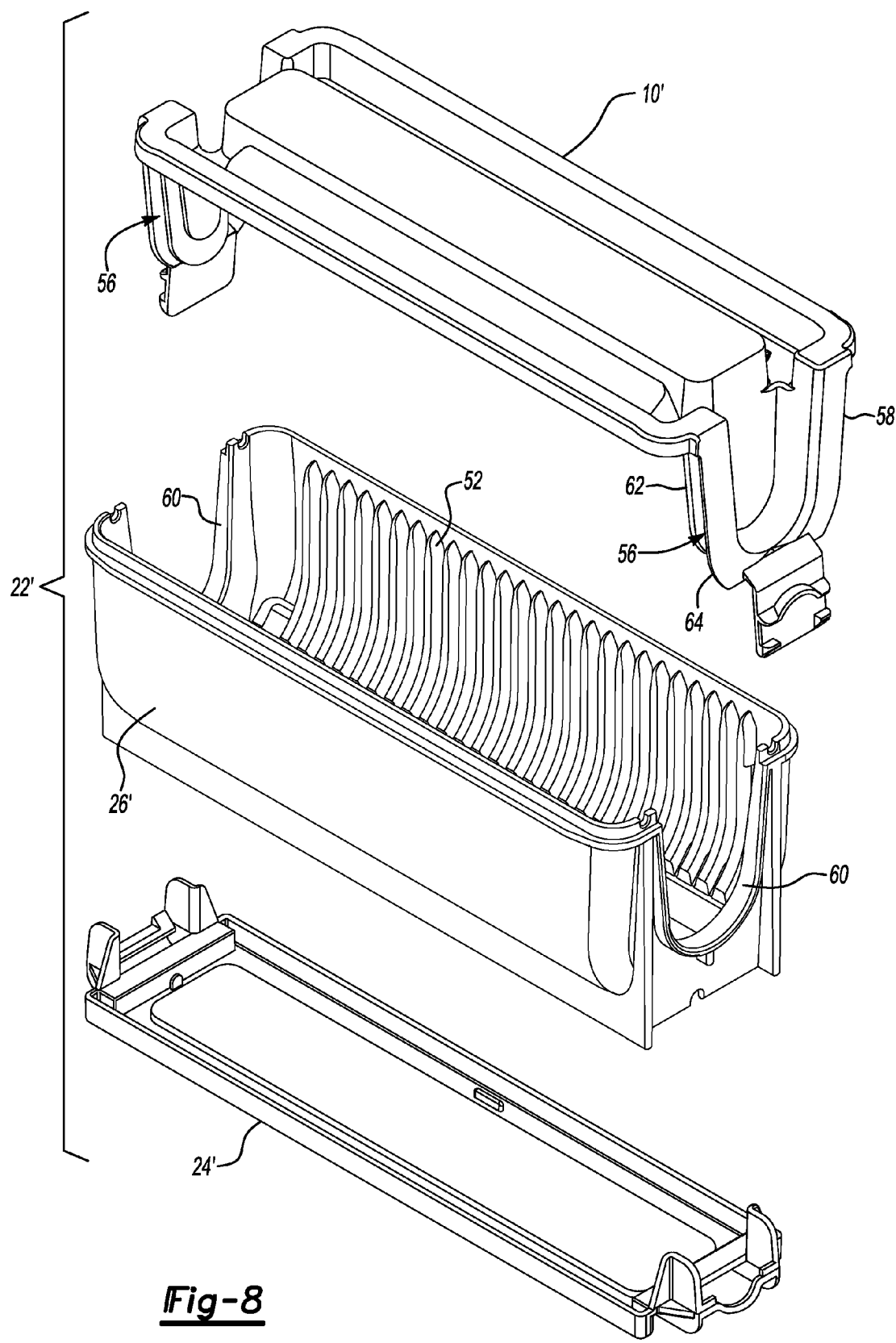
FIG. 8 is an exploded, perspective view of another example container.

FIG. 8 shows another container configuration 22' incorporating the support members 12 and 18 on a container portion 10'. In this example, the container portion 10' is a cover that is secured to a base 24' with a cassette 26' between them. The support members 12 and 18 are on a surface of the portion 10' facing slots 52 on the cassette 26' for securing disks in a desired position within the container.

One feature of the example of FIG. 8 is that the container portion 10' (i.e., the cover) has a channel 56 along an edge 58. A complementary portion 60 of the cassette 26' is received at least partially into the channel 56 when the cassette 26' and the container portion 10' are brought together. The edge walls 62, 64 that establish sides of the channel 56 overlap the complementary portion 60 of the cassette in that position. This arrangement provides a tortuous path between the interior of the container 22' and the surrounding environment that is operative to prevent outside contaminants from entering the container and contacting a surface on the disks inside the container. This feature adds further security to the integrity of the disks within this example container.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A container, comprising:
a container portion including a plurality of first resilient support members having a first height and a plurality of second support members having a second, smaller height, the first resilient support members are configured to contact an edge of a component inside the container, the second support members are each positioned relative to a corresponding one of the first resilient support members such that each second support member contacts the edge of the component when the corresponding first resilient support member sufficiently deflects, wherein there is a spacing between each first resilient support member and a corresponding one of the second support members, the spacing extending along at least a portion of the second height, some of the spacing being filled with material having a third height that is smaller than the second height, wherein the first height is between an inside surface on the container portion and an end of each first resilient support member, the second height is between the inside surface and an end of each second support member and the third height is between the inside surface and an end of the material in the spacing, wherein a first set of the plurality of first resilient support members are arranged in rows that are separated a first distance and a second set of the plurality of first resilient support members are arranged in rows that are separated a second, greater distance.

2. The container of claim 1, wherein each of the first and second support members has a nesting contour near an end that is configured to center a component on the support member.

3. The container of claim 2, wherein the nesting contour is generally V-shaped.

4. The container of claim 1, wherein the first and second sets are supported on the container portion such that any component contacting support members in the first set is spaced away from an inside surface of the container portion a distance that is approximately the same as a distance that any component contacting support members in the second set is spaced away from the inside surface.

5. The container of claim 1, wherein the plurality of first resilient support members are configured to establish a plurality of receiving slots, each receiving slot established by the two of the support members of the first set is adjacent a receiving slot established by two of the support members in the second set.

6. The container of claim 1, wherein the first and second sets alternate along the rows.

7. The container of claim 1, wherein the first resilient support members and the second support members are integrally molded with the container portion.

8. The container of claim 1, wherein the container portion comprises one of a cover or base and comprising the other of the base or cover that is selectively secured to the container portion and including a cassette having a plurality of slots corresponding to an edge of a component intended to be placed in the container and the first height is selected to maintain any component in a corresponding one of the slots when the cover is secured to the base.

9. The container of claim 8, wherein the container portion includes a channel along at least one edge that receives a correspondingly configured portion of the cassette such that a tortuous path is established within the channel at the corresponding interface between the container portion and the cassette.

10. The container of claim 1, wherein the container portion includes a channel along at least one edge that receives a correspondingly configured portion of another portion of the container such that a tortuous path is established within the channel at the corresponding interface between the container portions.

11. The container of claim 1, wherein each second support member contacts the edge of the component only when the corresponding first resilient support member sufficiently deflects.

12. A container, comprising:
a container portion including a plurality of first resilient support members having a first height and a plurality of second support members having a second, smaller height, the first resilient support members are configured to contact an edge of a component inside the container, the second support members are each positioned relative to a corresponding one of the first resilient support members such that each second support member contacts the edge of the component when the corresponding first resilient support member sufficiently deflects, wherein there is a spacing between each first resilient support member and a corresponding one of the second support members, the spacing extending along at least a portion of the second height, the spacing being less than a difference between the first height and the second height, wherein a first set of the plurality of first resilient support members are arranged in rows that are separated a first distance and a second set of the plurality of first resilient support members are arranged in rows that are separated a second, greater distance.

13. The container of claim 12, wherein some of the spacing is filled with material having a third height that is smaller than the second height, wherein the first height is between an inside surface on the container portion and an end of each first resilient support member, the second height is between the inside surface and an end of each second support member and the third height is between the inside surface and an end of the material in the spacing.

14. The container of claim 12, wherein the first and second sets are supported on the container portion such that any component contacting support members in the first set is spaced away from an inside surface of the container portion a distance that is approximately the same as a distance that any component contacting support members in the second set is spaced away from the inside surface.

15. The container of claim 12, wherein the plurality of first resilient support members are configured to establish a plurality of receiving slots, each receiving slot established by the two of the support members of the first set is adjacent a receiving slot established by two of the support members in the second set.

16. The container of claim 12, wherein the first and second sets alternate along the rows.

17. The container of claim 12, wherein the container portion includes a channel along at least one edge that receives a correspondingly configured portion of another portion of the container such that a tortuous path is established within the channel at the corresponding interface between the container portions.

* * * * *